(12) United States Patent
Lin et al.

(10) Patent No.: US 6,232,150 B1
(45) Date of Patent: May 15, 2001

(54) PROCESS FOR MAKING MICROSTRUCTURES AND MICROSTRUCTURES MADE THEREBY

(75) Inventors: Liwei Lin; Yu-Ting Cheng; Khalil Najafi; Kensall D. Wise, all of Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/204,473

(22) Filed: Dec. 3, 1998

(51) Int. Cl.⁷ .......................... H01L 21/44; H01L 21/48; H01L 21/00; H01L 21/36; H01L 21/46

(52) U.S. Cl. ..................... 438/119; 438/54; 438/456

(58) Field of Search ................... 438/51–54, 55, 438/64, 67, 88, 89, 106, 107, 112, 119, 124, 126, 455, 456, 466, 470

(56) References Cited

U.S. PATENT DOCUMENTS

| | | | |
|---|---|---|---|
| 3,686,545 | 8/1972 | Shoji | 317/235 R |
| 4,079,408 | 3/1978 | Kwap et al. | 357/50 |
| 4,103,273 | 7/1978 | Keller | 338/2 |
| 4,121,334 | 10/1978 | Wallis | 29/589 |
| 4,319,397 | 3/1982 | Tanabe et al. | 29/589 |
| 4,384,899 | 5/1983 | Myers | 148/1.5 |
| 4,426,788 | 1/1984 | Hirose et al. | 33/395 |
| 4,438,181 | 3/1984 | Schroeder | 428/571 |
| 4,625,561 | 12/1986 | Mikkor | 73/724 |
| 4,802,952 | 2/1989 | Kobori et al. | 156/634 |
| 4,861,420 | 8/1989 | Knutti et al. | 156/633 |
| 4,953,387 | 9/1990 | Johnson et al. | 73/25.03 |
| 4,962,062 | 10/1990 | Uchiyama et al. | 437/225 |
| 5,000,817 | 3/1991 | Aine | 156/633 |
| 5,002,901 * | 3/1991 | Kurtz et al. | 437/228 |
| 5,006,487 | 4/1991 | Stokes | 437/228 |
| 5,058,856 | 10/1991 | Gordon et al. | 251/11 |
| 5,095,752 * | 3/1992 | Suzuki et al. | 73/517 |
| 5,164,328 | 11/1992 | Dunn et al. | 437/54 |
| 5,221,415 | 6/1993 | Albrecht et al. | 156/629 |
| 5,225,373 | 7/1993 | Takahashi et al. | 437/209 |
| 5,262,127 | 11/1993 | Wise et al. | 422/98 |
| 5,273,939 | 12/1993 | Becker et al. | 437/209 |
| 5,286,671 | 2/1994 | Kurtz et al. | 437/64 |
| 5,296,255 | 3/1994 | Gland et al. | 427/8 |
| 5,392,651 | 2/1995 | Suzuki et al. | 73/517 R |
| 5,399,232 | 3/1995 | Albrecht et al. | 156/633 |
| 5,421,943 * | 6/1995 | Tam et al. | 156/273.9 |
| 5,492,596 | 2/1996 | Cho | 156/632.1 |
| 5,545,594 | 8/1996 | Cahill | 437/228 |
| 5,576,251 | 11/1996 | Garabedian et al. | 437/228 |
| 5,585,311 | 12/1996 | Ko | 437/228 |
| 5,589,082 | 12/1996 | Lin et al. | 216/2 |
| 5,591,679 * | 1/1997 | Jakobsen et al. | 437/228 |
| 5,614,113 | 3/1997 | Hwang et al. | 219/121.64 |
| 5,656,512 | 8/1997 | Beitman | 438/52 |
| 5,668,033 | 9/1997 | Ohara et al. | 438/113 |
| 5,706,577 | 1/1998 | Halstead | 29/827 |
| 5,731,587 | 3/1998 | DiBattista et al. | 250/443.1 |
| 5,837,562 * | 11/1998 | Cho | 438/51 |
| 6,063,442 * | 5/2000 | Cohen et al. | 427/250 |

OTHER PUBLICATIONS

*Advanced Surface Coatings: A Handbook of Surface Engineering*, edited by D.S. Rickerby and A. Matthews, and published by Chapman & Hall, New York, 1991.

* cited by examiner

Primary Examiner—John F. Niebling
Assistant Examiner—Viktor Simkovic
(74) Attorney, Agent, or Firm—Harness, Dickey & Pierce

(57) ABSTRACT

A method for making a microstructure assembly, the method including the steps of providing a first substrate and a second substrate; depositing an electrically conductive material on the second substrate; contacting the second substrate carrying the electrically conductive material with the first substrate; and then supplying current to the electrically conductive material to locally elevate the temperature of said electrically conductive material and cause formation of a bond between the first substrate and the second substrate.

23 Claims, 9 Drawing Sheets

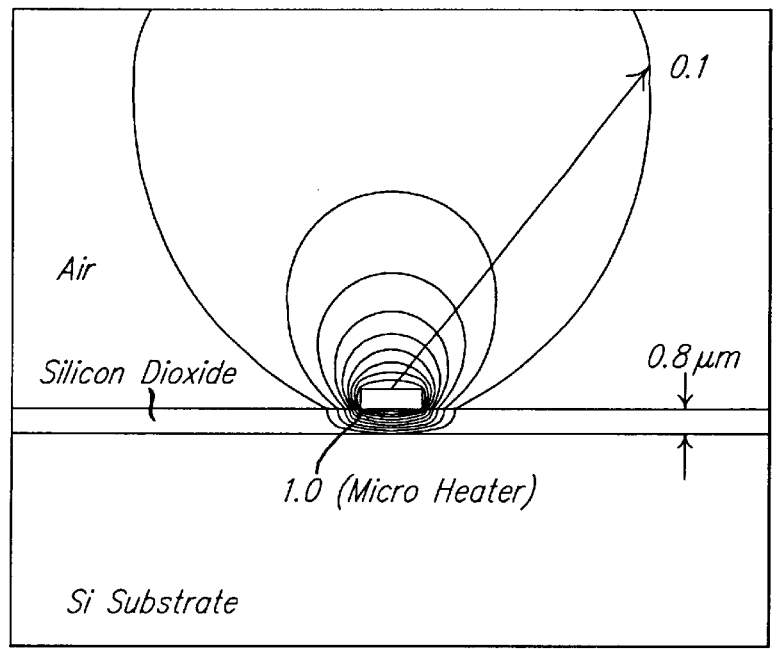
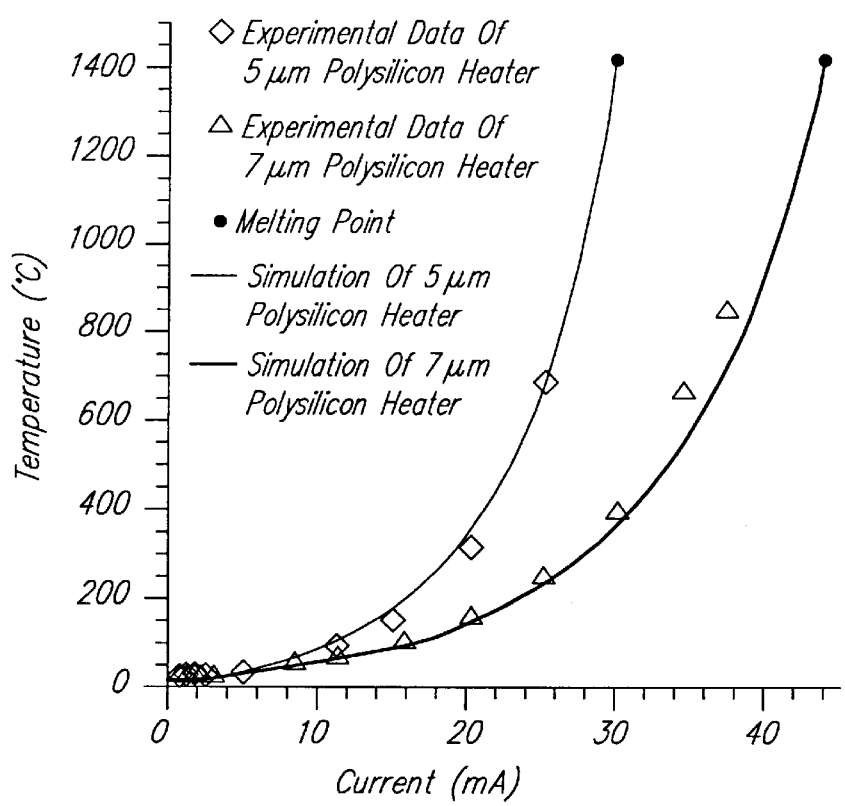

PROCESS FOR MAKING MICROSTRUCTURES AND MICROSTRUCTURES MADE THEREBY

STATEMENT OF GOVERNMENT SUPPORT

This invention was made with government support provided by the National Science Foundation (NSF) under the terms of Contract No. ECS-9734421 and provided by the Defense Advanced Research Projects Agency (DARPA) under the terms of Contract No. F30602-98-2-0227. The government has certain rights in the invention.

FIELD OF THE INVENTION

The invention relates to miniaturized devices, referred to as microelectronic devices or microdevices, including those used in integrated circuits, and the invention further relates to methods for fabricating assemblies which contain such microdevices.

BACKGROUND OF THE INVENTION

The fabrication of modern, high-speed microelectronic devices includes a number of intricate and costly processing and fabrication steps which are conducted on a very small, microscopic scale. Various types of such microelectronic devices, as well as microelectronic integrated circuits (IC's) which incorporate as many as thousands of such devices, are fabricated and mass produced on silicon wafers. Each silicon wafer generally comprises an array of numerous electrically-isolated individual integrated microelectronic circuits. Each individual circuit on the wafer typically has numerous fabricated pads which are located proximate to the bulk of the circuit and which are electrically connected to the individual circuit itself. The pads serve as electrical interfaces for routing electrical current through the individual microelectronic circuit. Once a silicon wafer and the array of circuits embedded thereon is completely fabricated, the wafer is then generally sliced apart to thereby physically separate the array of circuits into individual circuits. Each individual circuit on its separated portion of the previously-whole silicon wafer is generically referred to as a "chip." In this separated chip form, an individual circuit can then be wire-bonded into, for example, a plastic or ceramic package and sealed therein for general electrical and thermal insulation purposes. The pads of the packaged chip are commonly wirebonded to electrical leads mounted on the outside of the package to provide electrical access to the packaged chip via the external leads.

Presently, free-standing micro-structure devices called MEMS (Micro-Electrical Mechanical Systems) are gaining ever-growing popularity in the microelectronics industry. Such MEMS devices may include, for example, a micro-accelerometer, a micro-mechanical filter, a pressure sensor, a gyroscope, or a micro-resonator. In light of such popularity, manufacturers are now attempting to fabricate composite devices which integrate both microelectronic integrated circuits and MEMS together on the same chip. However, due to the unique nature of MEMS devices, more reliable packaging processes and methods need to be developed to simultaneously accommodate both microelectronic integrated circuits and MEMS so that composite devices can be mass-produced commercially.

More particularly, many MEMS devices, by their very nature, must be encapsulated and hermetically sealed within a microshell in order to operate properly. For example, a MEMS device such as a pressure sensor or an accelerometer has movable micro-mechanical parts which must be permitted to move for the MEMS to operate properly. Such MEMS require hermetic encapsulation within a microshell to prevent contaminants, such as dust, from interfering with the MEMS device performance. Furthermore, due to the fact that a typical MEMS device has a size on the order of $10^{-6}$ to $10^{-3}$ meter, the fabrication and precise positioning of a microshell over a MEMS device to thereby encapsulate the device can prove to be a significant challenge, for such a small scale environment can require microfabrication and precision positioning on the order of $10^{-7}$ to $10^{-9}$ meter.

One prior art process method for hermetically encapsulating and thereby protecting a MEMS device (in this instance, a microresonator) is described in U.S. Pat. No. 5,589,082, incorporated herein in its entirety by reference (see FIG. 1). The initial steps in the process include standard surface micromachining steps which ultimately produce a comb-shaped resonator MEMS device mounted on a silicon wafer substrate (see FIG. 1(a)). Since the fingers of the comb-shaped resonator must be protected so that they are free to move to help operate the resonator correctly, a hermetically-sealed microshell needs to be formed about the resonator. Thus, next, a thick layer of PSG (phosphorus doped glass) is deposited on the silicon substrate so that the PSG surrounds and covers the MEMS device, thereby defining the area to be sealed by a microshell (see FIG. 1(b)). Then, a thin layer of PSG is deposited, patterned, and etched to form etch channels (see FIG. 1(c)). Next, a thin layer silicon nitride is deposited over the thick layer of PSG to define a microshell, and etch holes are thereafter precisely defined in the thin layer of silicon nitride (see FIG. 1(d)). Thereafter, all PSG within the microshell is etched away in a concentrated HF gas bath via the etch holes. After rinsing in water and in methanol, the silicon wafer and its encapsulated MEMS device is dried using a supercritical CO2 process. Finally, a relatively thin layer of nitride is deposited to thereby hermetically seal the MEMS resonator device within its microshell, and contact pads are thereafter etched open to provide electrical access to the MEMS device (see FIG. 1(e)). In this manner, the MEMS device is protected from contaminants, and electrical access is also provided.

This particular MEMS encapsulation process method, as briefly described hereinabove and more fully explained in U.S. Pat. No. 5,589,082, is operable for the very narrow purpose intended, but a simpler and more versatile process method is instead desired. In particular, a process method which hermetically encapsulizes a MEMS device while at the same time is highly compatible with standard process methods used to fabricate microelectronic integrated circuits is highly desirable, for such would enable composite devices to be mass-produced commercially.

Another prior art process method for encapsulating a MEMS device is described in U.S. Pat. No. 5,576,251, incorporated herein in its entirety by reference, wherein two substrates are fused together to form a protective covering for a MEMS device. A bonding material is interposed between the two substrates, and the temperature of the bonding material is raised to about 950° C. for about 30 minutes during which time fusion bonding of the two substrates occurs, and chemical reactions remove gas from the cavity between the two substrates, thereby creating a vacuum and a hermetically sealed enclosure about the MEMS device. In another prior art process method, described in U.S. Pat. No. 5,668,033, global heating is utilized to bond two substrates together within an oven. In this particular method, the entire MEMS structure must be heated in an oven to a temperature sufficient to form the bond between the two substrates. Such a temperature, however, often has undesirable and damaging effects on the MEMS device. In still another prior art process method, described in U.S. Pat. No. 4,625,561, the method therein also teaches bonding by global heating in a furnace. One common aspect of the particular prior art encapsulation and bonding methods alluded to hereinabove is that a high temperature is required to facilitate the process of bonding. As a result, such methods are not suitable for use in situations involving microelectronic integrated circuits and/or MEMS which cannot tolerate exposure to such high temperatures.

In general, micromachining and microfabrication process techniques which are typically used to produce MEMS devices and/or microelectronic integrated circuits are very costly. In addition to being costly to produce, MEMS devices and microelectronic integrated circuits are typically temperature sensitive and can be permanently damaged if exposed to high temperatures. Thus, the integration of a MEMS device with a microelectronic integrated circuit device must be carefully executed so as to not permanently damage any expensive temperature-sensitive device. In light of such, a common critical concern in fabricating a composite device is how to integrate a free-standing MEMS device, which requires a high-temperature bonding process for encapsulation, with a temperature-sensitive microelectronic integrated circuit.

Bonding techniques, including fusion bonding (such as silicon-to-silicon bonding), eutectic bonding (such as silicon-to-gold bonding), and anodic bonding (such as silicon-to-glass bonding), have all been used both in microelectronic integrated circuit and MEMS fabrication for many years. Each of these different bonding processes require two basic elements in order to be successful. First, the two surfaces to be bonded must each be flat to ensure intimate contact for proper bonding. Second, proper processing temperatures are required to provide the proper bonding energy. For example, a conventional silicon-to-silicon fusion bonding process occurs at a bonding temperature of above 1,000° C. On the other hand, anodic bonding is performed at a lower temperature of about 450° C., but requires the assistance of a high electrostatic field. Silicon-gold eutectic bonding theoretically occurs at a temperature of 363° C. Among these bonding processes, one common drawback is the high temperature requirement that may damage and degrade temperature-sensitive integrated circuits and/or MEMS. Therefore, such bonding processes are not generally applicable in fabricating or packaging devices when temperature-sensitive devices are involved. For the past few years, many efforts have been undertaken to find a reliable bonding process that can be conducted at a low temperature. Unfortunately, the success of each of these bonding processes depends highly upon a particular fabrication process' idiosyncracies, such as the particular bonding material used, surface treatment, and the flatness of the actual surfaces which are to be bonded together. Due to the significant number of such contingencies, such bonding processes are generally neither adaptable nor economical for the large scale production of composite devices.

Therefore, presently known high-temperature bonding process techniques, for encapsulating a MEMS device under a microshell, are highly process dependent and are generally not suitable for producing composite devices which incorporate temperature-sensitive microelectronic integrated circuits, for such bonding techniques require high temperatures which may damage temperature-sensitive integrated circuits and/or MEMS devices. In addition, such bonding processes typically strictly require very flat bonding surfaces, select bonding materials, and very tight process control to be successful. As a result, presently known bonding processes are not ideal for encapsulating free-standing MEMS structures on composite devices.

SUMMARY OF THE INVENTION

The present invention relates to a method for making a microstructure assembly, the method including the steps of providing a first substrate and a second substrate; depositing an electrically conductive material, called a microheater, on the second substrate; contacting the second substrate carrying the electrically conductive material with the first substrate; and then supplying current to the electrically conductive material to locally elevate the temperature of the electrically conductive material and cause the formation of a bond between the first substrate and the second substrate.

Furthermore, the present invention also generally relates to a microstructure having two substrate bodies bonded together at selected surface bonding regions on the two bodies. More particularly, the microstructure is comprised of a first body, having a first surface and which comprises a first material, and a second body, having a second surface and which comprises a second material. A resistive heating material, called a microheater, is carried on the second surface such that the heating material defines a bonding area between the first surface and the second surface. A bonding interface joining the first and second substrate bodies together, the bonding surface comprising the first material and a bonding material between the surfaces, is created as a result of the first material and the bonding material being bonded together by localized heat generated from current which is applied to and passed through the resistive heating material.

In this way, as described in significant detail hereinbelow according to the present invention, composite devices which include both microelectronic integrated circuits and a MEMS device can now be fabricated and mass produced through the utilization of localized, high-temperature bonding processes and/or techniques. Such localized, high-temperature bonding ensures that microshells are properly bonded over MEMS devices to hermetically encapsulate and protect the MEMS devices while at the same time ensuring that nearby temperature-sensitive microelectronic integrated circuits are not damaged from the high temperatures generated during the bonding process. The precise utilization and positioning of microheaters in conjunction with thermally insulating materials ensures that the high-temperature heat generated during the bonding process is precisely localized and confined so as to not permanently damage nearby temperature-sensitive circuits and/or devices.

These and other objects, features, and advantages will become apparent from the following detailed description of the preferred embodiment, the claims, and the accompanying drawings.

BRIEF DESCRIPTION OF THE DRAWINGS

FIG. 3 shows isotherms around a 2 $\mu$m wide microheater.

FIG. 4 illustrates agreement between experimental and simulation results of 5 and 7 $\mu$m wide polysilicon microheaters under different current inputs.

FIG. 11 contains 11a and 11b which are schematics showing respective caps, similar to that of FIG. 10, being aligned with a substrate for bonding thereto.

DETAILED DESCRIPTION OF THE PREFERRED EMBODIMENTS

Figure 1A:
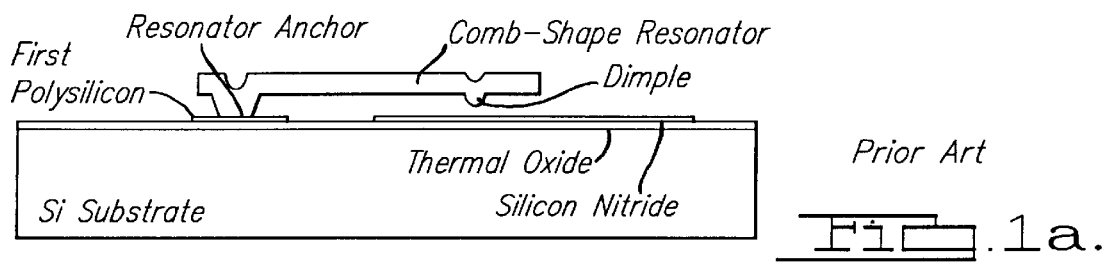
FIG. 1 is an illustration of a prior art process method for fabricating a protective microshell covering to encapsulate a MEMS device on a silicon substrate.
Figure 1B:
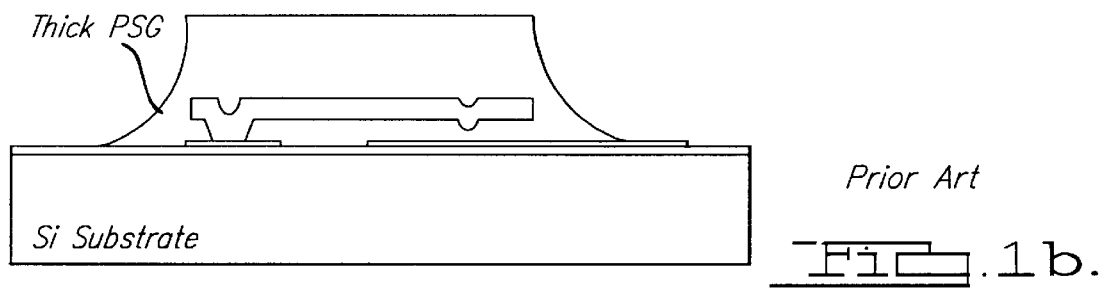
Figure 1C:
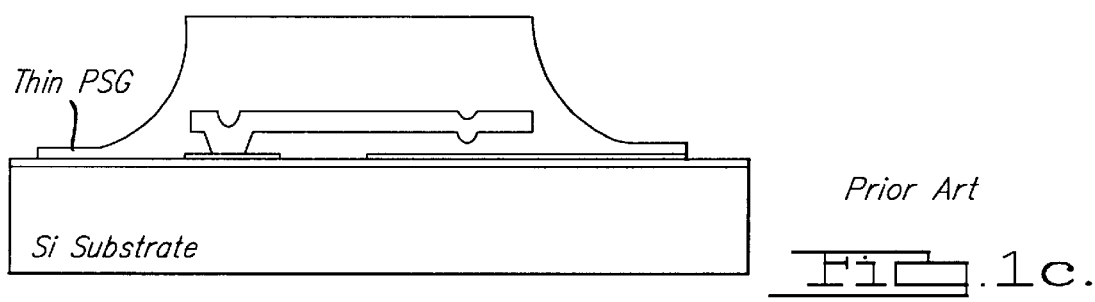
Figure 1D:
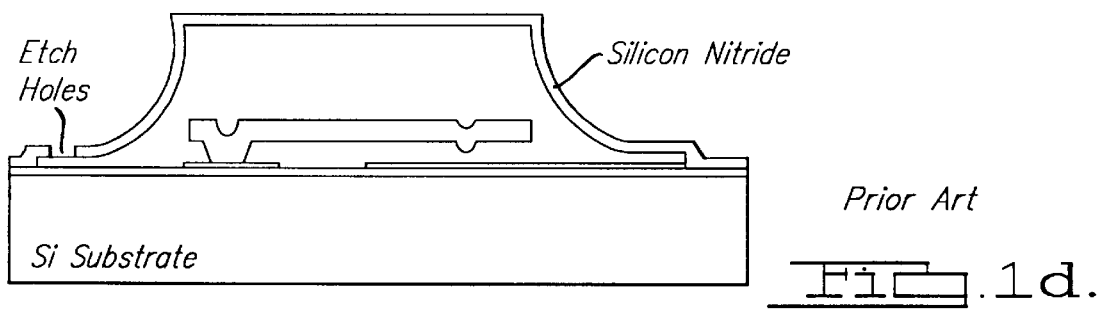
Figure 1E:
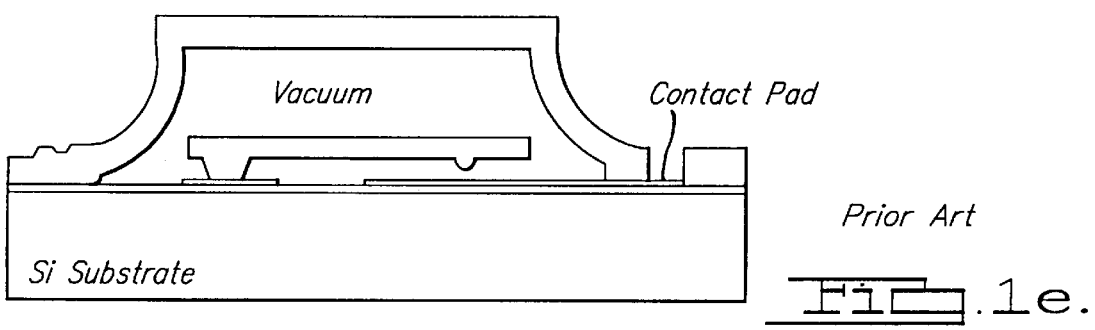

The present invention provides a new bonding process for encapsulating MEMS devices based on the concept of localized high temperature bonding. High temperature, localized bonding is accomplished along a defined bonding path between two bodies. The regions of the bodies adjacent the path are maintained at a relatively low temperature. The localized high temperature causes softening of the bonding material which compensates for rough bonding surfaces on the bodies which are to be bonded together. Such provides a very effective seal, for it bonds the two bodies together while simultaneously minimizing adverse temperature effects in regions adjacent the bonded area.

The particular method of the present invention is useful to prepare and situate a variety of configurations of microstructures exemplified in the following description. In one embodiment, the overall microstructure comprises two bodies bonded together at their respective bonding surfaces. The first body has a first surface which comprises a first material, and the second body has a second surface which comprises a second material. A resistance microheater is attached to the second body at the second surface. The microheater is formed of a third material, and the microheater defines a path of a bonding area (pad) between the first surface of the first body and the second surface of the second body. The microheater is electrically conductive, and the path defined by the microheater is an electrically conductive path. Preferably, the materials of the first and second surfaces comprise an insulation material which prevents electrical current from deviating from the electrically conductive path of the microheater.

When current is supplied to the microheater to thereby generate bond-facilitating heat, a bonded area is formed which joins regions of the first and second bodies to one another. This bonded area or region is referred to as a bonding interface. Regions adjacent the bonding interface remain at relatively low, near ambient temperature when heat supplied by the microheater joins the bodies together.

At least one of the bodies has a cavity with an opening defined therein. The bodies are bonded to together such that the opening is disposed between the bodies. The bonding path of the microheater circumscribes the opening, and the bonding interface forms a seal which cooperates with the first and second bodies to enclose the cavity. The cavity may contain a microdevice, such as a microelectronic sensor, a micro-electrical mechanical (MEMS) device, or other miniaturized electronic component.

In one embodiment of the method according to the present invention, the assembly which comprises the microelectronic device is prepared by first placing the microelectronic device on a first substrate. Next, a second substrate is prepared having a layer of electrically insulating material on its surface, which layer is also preferably thermally insulating. Next, a cavity is etched into the surface of the second substrate. A microheater is placed on the insulating layer of the second substrate. The microheater is arranged on the surface in a path which circumscribes the opening of the cavity. A layer of electrically insulating material is then placed on the second substrate to cover at least the microheater and the interior surface of the cavity. Then, a bonding material is placed over the electrically insulating layer on the second substrate in a pattern which follows the path of the microheater.

Finally, the first substrate, which carries the microelectronic device, is placed in contact with the second substrate carrying the microheater. Electric current is then supplied to the microheater to elevate the temperature of the microheater and cause the formation of a bond between the first substrate and the second substrate. The microheater, being a resistance heater, provides bond-facilitating heat only along the path where a bond is to be formed. The electrically isolating material on both sides of the microheater helps to precisely define and confine the path of electric current and heat flow. Therefore, the bond is formed with almost no temperature change to regions adjacent the bonding interface where the bond is formed. The joining of the first and second substrates by localized, high-temperature bonding facilitated by the resistance microheater hermetically seals the cavity with the microelectronic device contained therein and does not adversely affect adjacent regions or components.

In one embodiment, the substrate which comprises the cavity may be considered to be a protective cap or a microshell. The material of this protective cap may be selected from any material which is rigid enough to protect the underlying device encapsulated within the cavity. Therefore, any material may be selected, including but not limited to glass, silicon, plastic, and metal. The material of the substrate carrying the microelectronic device is also not limited and may also be comprised of any of the materials listed above. However, the substrate carrying the microelectronic device must include a layer which is electrically isolating. This layer separates the material of the substrate from the resistance microheater. Such separation is necessary to define the path of the microheater and prevent current from flowing into the substrate in a situation where the substrate itself has electrically conductive features. The layer is preferably also thermal insulating so that the bond-facilitating heat generated by the resistance microheater is confined to the area where the bond is desired.

In the case where the bonding material itself is electrically conductive, it is preferred that the surface of the first substrate which comes in contact with the bonding material be electrically non-conductive. Thus, the first substrate may generally comprise any material. However, if the first substrate is electrically conductive, then the first substrate must have an electrically insulating layer on its bonding surface which comes in contact with the bonding material, if the bonding material is also electrically conductive.

The microheater may be formed from a variety of materials so long as they are electrically conductive and suitable for operation as a resistance heater. The materials from which the microheater may be formed are, by example, polysilicon, gold, titanium, tungsten, copper, aluminum, platinum, and other refractory metals. The term refractory metal indicates a metal or alloy that is capable of enduring high temperatures. Essentially, any electrically conductive material may be selected and the temperature at which the bonding is desired to occur will typically determine the selection of the material.

In some cases, the microheater may itself constitute the bonding material. Alternatively, the microheater and the bonding material may constitute separate layers. In this case, if the bonding material is electrically conductive, it is preferred that a layer of electrically insulating material be disposed between the microheater and the bonding material so as to better control the path of the current through the microheater and prevent the current from being directed through the bonding material.

Materials which may function as bonding materials include polysilicon, doped polysilicon, gold, silicon dioxide, copper, titanium, glass frit, PSG, BSG, and soldering materials like indium, silicon/gold alloy, and silicon/aluminum alloy. The PSG stands for phosphosilicate glass, also referred to as phosphorous doped glass. It is a glass (silicon dioxide) with some phosphorous content. Similarly, the BSG stands for glass doped with boron.

Materials which may function as both a microheater and a bonding material include polysilicon, doped polysilicon, gold, and aluminum.

Polysilicon is a polycrystalline silicon which constitutes grains of silicon grown together. It is relatively easy to fabricate layers of polysilicon on a substrate by chemical vapor deposition (CVD) means. Polysilicon is conveniently grown in an oven or reactor by CVD. Such polysilicon is in contrast to silicon which is a single crystal material conventionally known.

If dissipation of current through and from the bonding material is not a concern, then the microheater and bonding material may constitute one integrated single element, or the microheater need not be insulated from the bonding material. The bonding material is essentially any material which, when heated, is capable of forming a bond. The bond achieved by the method according to the present invention is preferably a fusion bond, or a bond formed by eutectic joining of materials. Therefore, the bonding material is selected on the basis of its ability to melt and form a fusion bond or by its ability to form a eutectic mixture with the material to which it is being joined. Thus, the bonding material is selected on the basis of its ability to fuse or to form a eutectic mixture at a temperature sufficiently low so that when bonding occurs, adjacent regions will not be subjected to an undesirably high temperature and damage nearby integrated circuits and/or MEMS.

As described earlier herein, an isolating film which is preferably also a thermally insulating film is produced on the surface of one or both of the substrates prior to execution of the bonding process. The bonding process is preferably performed by supplying current to the resistance microheater at the same time pressure or force is applied to one or both of the substrates to bias the substrates toward one another to be joined. When performing the bonding by heating and such pressurization, surface of the substrate is destroyed. As a result, bonding occurs uniformly over an entire region of the bonding surface with the result that it is possible to form the bonding interface with essentially no void therein. This is the case for both eutectic and fusion bonding.

In one embodiment, the bonding material is the decomposition product of a gaseous precursor which decomposes on contact with, or in the presence of, heat generated by the resistance microheater.

A wide variety of precursor reactions are available for the deposition of solid material and are usable in low-pressure chemical vapor deposition (LPCVD) systems. Such materials include, but are not limited to, molybdenum, nickel, carbon, silicon dioxide, alumina; nitrides of silicon, titanium, and boron; and carbides of silicon, titanium, and boron. Other materials able to be deposited by CVD or plasma-assisted CVD include tungsten, silicon dioxide, nitrides of tin and boron, and a composite of tin and boron. It is also known to deposit platinum by chemical vapor deposition. A variety of deposition materials and precursors are available and known to those skilled in the art. They will not be repeated here. A discussion of such materials and techniques can be found in *Advanced Surface Coatings: A Handbook of Surface Engineering*, edited by D. S. Rickerby and A. Matthews, and published by Chapman & Hall, New York, 1991.

The examples set forth below demonstrate use of the new bonding process based on localized high-temperature heating and utilizing the structure and methods of the invention. High temperature, localized bonding was accomplished along a defined bonding path between two bodies. The regions of the bodies adjacent the path were maintained at a low temperature, while localized high-temperature bonding was accomplished in the bonding path. By this method, localized high temperature was able to cause softening of the bonding material and compensate for rough surfaces on the bodies being joined together as evidenced by test results and microscopic examination of the bonding interface. The examples below demonstrate both localized fusion and eutectic bonding processes. In the examples, phosphorous-doped polysilicon was applied in the localized, silicon-to-glass fusion bonding experiments. Gold was used in the silicon-to-gold eutectic bonding tests. Polysilicon and gold films were patterned as line-shaped resistive heaters, and they reacted as bonding materials in the experiments. The experiments below demonstrate bonding by both processes was accomplished in five minutes and the high temperature bonding region was confined to a small area.

EXAMPLE 1—DIRECT BONDING

Part 1: Experimental Set-Up and Design Verification

Figure 13:
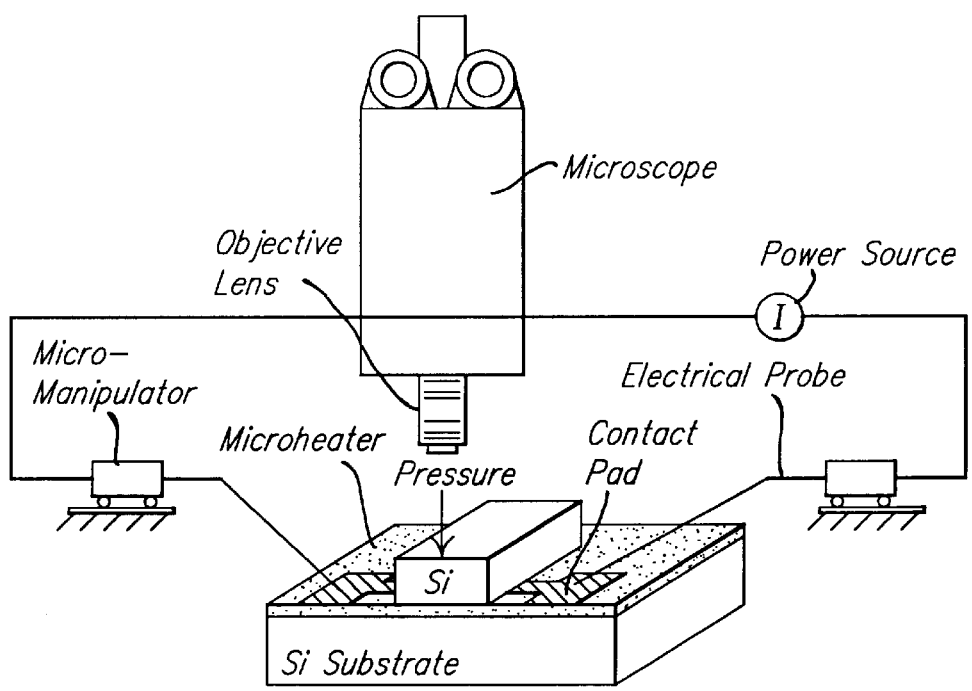
FIG. 13 is a schematic of an experimental setup for executing a localized bonding process.

FIG. 13 is an example of a small scale experimental testing setup for executing and implementing the method process and related structure according to the present invention. The microscope and micromanipulators together serve to align the top silicon substrate to the gold microheater which was deposited on the bottom silicon substrate. The alignment of the electrical probes onto the electrical contact pads associated with the microheater can also be achieved with the help of the microscope and the micromanipulators. In this manner, electrical current from a power source is successfully passed through the microheater to thereby initiate the localized, high-temperature bonding process according to the present invention.

Figure 2A:
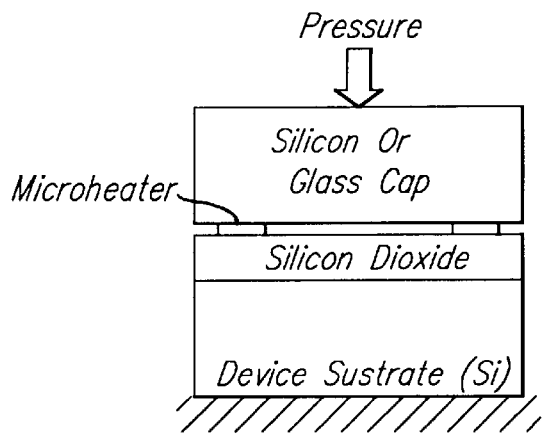
FIG. 2 is a schematic showing a localized bonding method and structure, including (a) a cross-sectional view, (b) a top view schematic of a microheater, and (c) a top view schematic of a temperature sensor.
Figure 2B:
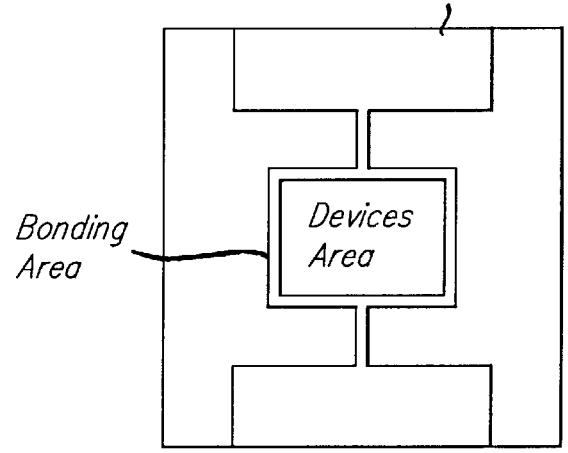
Figure 2C:
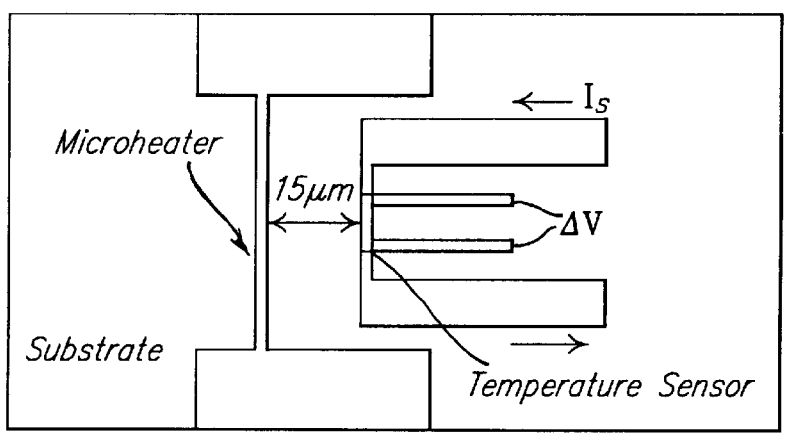

FIG. 2 shows the experimental setup for the bonding tests, including (a) a cross-sectional view, (b) a schematic view of the design of the microheater, and (c) a schematic view of the design of a temperature sensor. FIG. 2(a) shows the cross-sectional view where a silicon or glass cap was prepared to be bonded to the device substrate. A silicon dioxide layer was grown on the device substrate for electrical and thermal insulation. In the associated fusion bonding experiments, polysilicon was grown and patterned as both the heating and the bonding material. In the eutectic bonding experiment, gold resistive microheaters were likewise used as both the heating and the bonding materials. A proper pressure (about 1 MPa) was applied to put the cap substrate in contact with the bonding resistors (microheaters) as shown in FIG. 2(a). FIG. 2(b) shows the top view design of the enclosed-shape microheater usable to help encapsulate MEMS devices. In order to measure the temperature surrounding the microheater, a temperature sensor made of polysilicon or gold was placed 15 $\mu$m away from the bonding area as shown in FIG. 2(c). The temperature was sensed and characterized by monitoring the change in resistance of the microheater, by dividing $\Delta V$ by the input current I. Heat transfer study by this set-up detected a high temperature confined in a very small region. FIG. 3 shows the resulting isotherm of such a bonding system. When the microheater was at a high temperature of 1000° C., the temperature dropped to 100° C. less than 2 $\mu$m away from the microheater as shown. Therefore, localized and confined heating was successfully achieved by the proper arrangement of microheaters and insulation layers in this particular set-up.

Two widths, 5 or 7 $\mu$m, of the microheaters were designed and tested with a square bonding area of 500 $\mu$m$^2$. A pressure of 1 MPa was applied on top of two wafers and a current, which corresponded to the particular design of the microheaters, was passed through the heaters to provide the proper bonding temperature. An electro-thermal model based on the conservation of energy was used to estimate the temperature. FIG. 4 shows the simulation results (solid lines) and experiments (symbols) of polysilicon microheaters under different input currents without the cap substrate. The experimental data was calculated by assuming a linear dependence of resistivity with respect to temperature:

$$\rho(T)=\rho_o(1+E(T-T_o)) \quad (1)$$

where $\rho_o$ is the resistivity at room temperature and E is the temperature coefficient of resistivity. For N-type polysilicon with a dopant concentration of $7.5\times10^{19}$/cm$^3$, this temperature coefficient is about $1.2\times10^{-3}$/° K.

This same principle was utilized with the temperature sensor to determine the temperature changes and gradient at a short distance, such as 15 $\mu$m, away from the microheater. It was found that when an electric current of 30 mA was passed through the 5 $\mu$m polysilicon resistive heater, the temperature reached the melting point of polysilicon (~1415° C.). At the same time, the temperature sensor indicated a temperature increase of less than 40° C. Thus, the high temperature in the bonding region was successfully and very well confined in a small region within the device substrate.

Part 2: Localized Fusion Bonding

Based on the concept of localized high-temperature bonding, localized silicon-to-glass bonding was successfully accomplished using a glass cap substrate. First, a Pyrex glass cap substrate (7740 from Dow Corning) was placed and pressed on the top of polysilicon microheaters as shown in FIG. 2(a). A 31 mA input current was then applied to the 5 $\mu$m wide, 1.1 $\mu$m thick polysilicon microheater for about 5 minutes. This input current was close to that required to cause melting of polysilicon. This input current generated a temperature of about 1300° C. based on the current-temperature simulation that included the effect of the glass cap on top of the micro-heater. This temperature is slightly lower than the data shown in FIG. 4 under the same input current because of heat losses to the glass cap.

Figure 5:
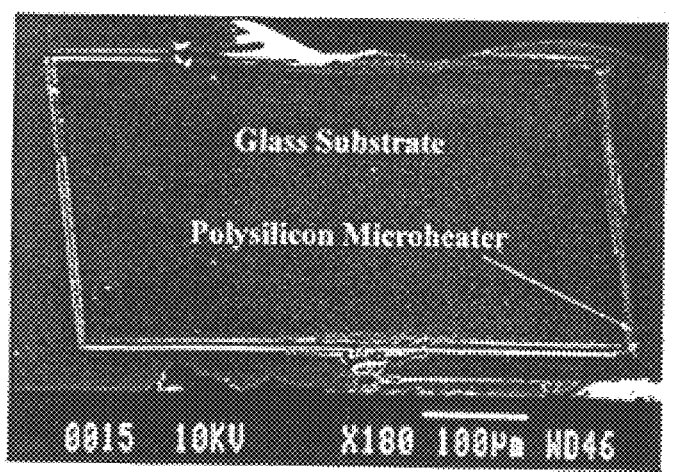
FIG. 5 is an SEM micrograph showing that the glass cap substrate is softened and has the shape of the polysilicon microheater.

FIG. 5 shows the SEM micrograph of a forcefully broken fusion bond on the glass cap. It was observed that the square shape microheater was reflected on the originally flat glass substrate. Moreover, part of the polysilicon was attached to the glass cap. This microphoto demonstrated two very important features for the localized fusion bonding experiment. First, it was very easy to raise the microheater temperature to be above the glass soften point of ~820° C., such that the glass cap is locally softened. Second, the applied pressure was high enough to cause intimate contact of the glass cap and the microheaters. Since intimate contact was made at the proper temperature and reaction time, a good and reliable fusion bond resulted.

Figure 6:
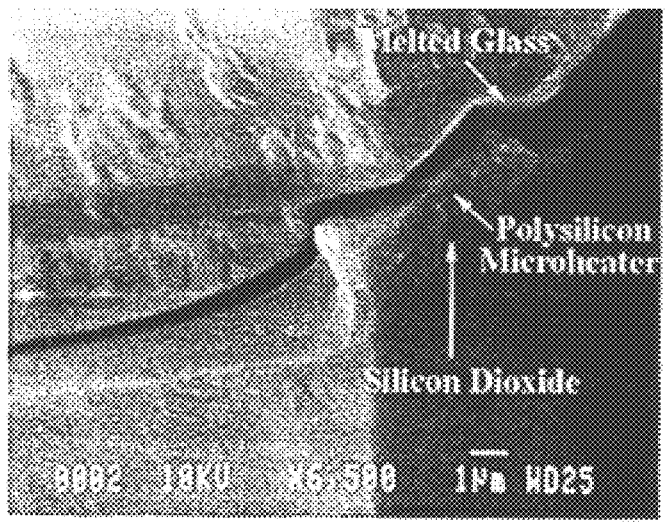
FIG. 6 is an SEM micrograph showing the localized silicon-glass fusion bonding. After the bond is forcefully broken, the microheater, the silicon dioxide, and the glass cover can each be clearly observed.
Figure 7:
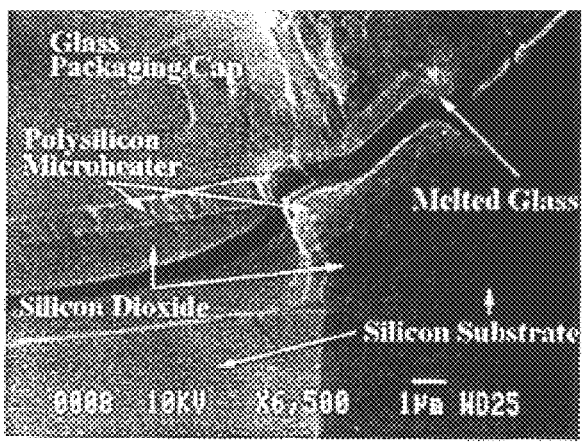
FIG. 7 shows a polysilicon microheater after being dipped into HF.

In order to determine the bonding strength, a close-up SEM microphoto was taken as shown in FIG. 6. For this particular sample, the breakage was along one of the microheaters. The polysilicon microheater, underneath the silicon dioxide layer and the top glass cap, was clearly identified. The morphology of glass near the heater line showed the glass had been softened locally. After dipping the sample into an HF solution, the polysilicon heater was clearly delineated as shown in FIG. 7. In this case, the polysilicon-glass bond seemed to be stronger than the bottom polysilicon-oxide adhesion where the broken trace was clearly observed. Therefore, these results strongly suggest that an excellent silicon-to-glass fusion bonding can be achieved with localized high-temperature bonding.

According to established fusion bonding principles, flat surfaces, hydrophilic surface treatment, sufficiently high bonding temperature, and reasonable bonding time together result in successful bonding. The typical conventional bonding temperature is above 1000° C. for about 2 hours. In the experiments presented here, microheaters were cleaned by SPM (sulfuric peroxide mixture, i.e. a mixture of $H_2SO_4$ and $H_2O_2$) followed by an HF dip and water rinse for proper hydrophilic surface treatment. Bright red light emitted from microheaters during the high-temperature bonding process. It was found that when the bonding temperature was raised to very close to the melting temperature of polysilicon, the silicon-to-glass fusion bonding occurred in less than 2 minutes. In another experiment, a lower bonding current of 29 mA, which corresponds to a temperature of about 1000° C., was applied continuously for 30 minutes. The result showed poor bonding strength and poor uniformity. According to these experimental results, hermetic bonding results when the bonding temperature is controlled to be very close to the melting point of the polysilicon material. At a lower bonding temperature, a significantly longer bonding period is needed to achieve such excellent bonding.

Part 3: Localized Eutectic Bonding

Figure 8:
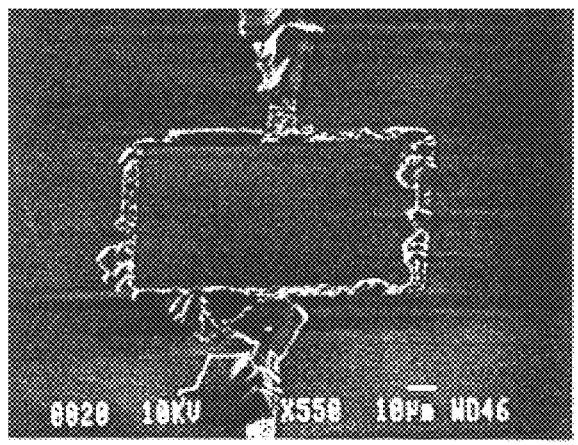
FIG. 8 is an SEM micrograph showing localized silicon-to-gold eutectic bonding. After the bond is forcefully broken, silicon attached to the gold line can be observed.

In the silicon-to-gold eutectic bonding experiments, gold microheaters were used both as the heating material and the bonding material. A silicon cap substrate was placed on top of the gold microheater, as shown in FIG. 2(a). A 0.27 A electric current was then applied to the 5 μm wide, 0.5 μm thick gold microheater for about 5 minutes. The bonding temperature was estimated to be about 800° C. During the bonding process, gold diffused into the silicon, and the resistivity of the gold line was thereby increased. Thus, it was necessary to increase the current density through the gold microheater to maintain a high bonding temperature during the bonding process. FIG. 8 shows the result of silicon-to-gold eutectic bonding by the technique of localized heating. It appeared that silicon was broken and attached to the gold microheater when the eutectic bond was forcefully broken. Moreover, uniform eutectic bonds were observed around the square shape microheater.

COMPARATIVE EXAMPLE

Figure 9:
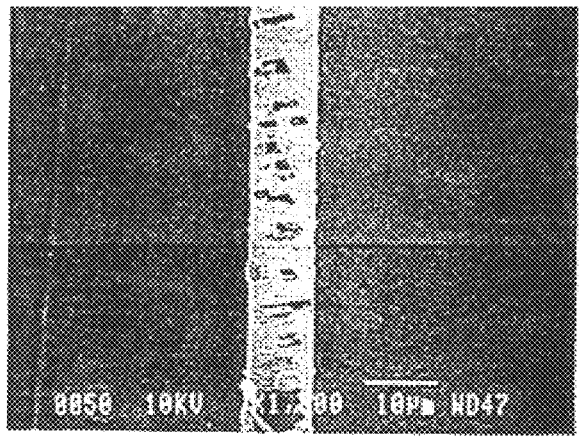
FIG. 9 is an SEM micrograph showing non-uniformity in a conventional eutectic bonding process.

For comparison purposes, the same eutectic bonding experiment was also performed by using the conventional eutectic bonding technique. The process was conducted in an oven that provided global heating and bonding. The processing temperature was first ramped to 410° C. in 10 minutes and was kept at 410° C. for 10 minutes before cooling down to room temperature in 10 minutes. FIG. 9 shows the bonding result in a SEM microphoto. Nonuniform eutectic bonding was clearly observed in this photo. This is probably the reason why hermetic sealing was not achieved. It is well-known that the diffusivity and solubility of gold into a silicon substrate both increase when the processing temperature increases. At higher bonding temperatures, as those used in the localized bonding process, more gold atoms can diffuse into silicon. Therefore, a thicker layer of gold-silicon alloy can form at a higher bonding temperature and a stronger eutectic bond is expected. However, this also results in the degradation of nearby heat-sensitive components. Therefore, a balance between achieving a good bond and the maintenance of component integrity is difficult and often impossible to achieve.

Temperature and processing time are the two key success factors for both fusion and eutectic bonding in order to achieve intimate contact as per the invention. In the silicon-to-glass fusion bonding system, atoms obtain thermal energy provided by temperature to overcome reaction barrier to form chemical bonds. In the silicon-to-gold eutectic bonding system, diffusion is activated under a high temperature environment when atoms overcome the diffusion barrier to form eutectic bonds. It is desirable to have high processing temperatures in both fusion and eutectic bonding processes for a higher diffusion constant and reaction rates. Localized heating provides an excellent way to accomplish the high temperature bonding requirement while maintaining low temperature at the wafer level. Therefore, fast reaction and strong bonding are expected to occur locally. There are many ways to achieve localized heating, including using microheaters or a focused micro-laser. The key structural design is to prevent the heat losses to the environment or substrate. An insulation layer (such as a silicon dioxide) underneath the heating element serves well for this purpose, as illustrated in FIG. 3. In accordance with the present invention, further design optimizations, of course, can be implemented based on basic heat transfer principles to improve the effectiveness of localized heating.

In some embodiments, direct silicon fusion and eutectic bonding techniques are conducted where the heating elements also serve as the bonding materials. One drawback for the direct bonding technique is that the bonding materials may diffuse or melt during the process. Therefore, the resistance of the microheater changes, and it is very difficult to control the bonding temperature and process. The same localized heating techniques are also shown by adding soldering materials for indirect bonding. Since the microheaters can be preserved during the indirect bonding process, good temperature and process control are expected. These methods are very well suited to encapsulation of microresonators in a vacuum environment with hermetic sealing to package microresonators.

The method of the invention is usable to prepare a micropackage (microshell) as shown in FIGS. 10 and 11. FIG. 10(a) shows a silicon wafer with an oxide layer and a cavity. The structure of FIG. 10(a) is prepared by first growing an oxide layer on the silicon wafer. This oxide layer functions both as thermal insulation and electrical insulation layered between the microheater and the silicon wafer substrate. The silicon oxide is chosen because it has very good thermal and electrical insulation properties, and it can be grown easily on silicon. The silicon oxide layer is then patterned to define the cavity area, and the cavity is thereafter etched to a desired depth. This cavity can then be used to protect a microdevice, such as a MEMS device.

Referring again to FIGS. 10 and 11, it was described that insulation and isolation materials were used. In FIG. 10, the silicon dioxide layer has both thermal and electrical insulating characteristics. In the broadest aspect, both electrical and thermal insulating requirements are not strictly required. The electrical insulation layer is preferred in order to help control the electrical power output. The thermal insulation is also preferred in order to help the efficiency of the heating. Although one may accomplish the same result without using a dual purpose layer or more than one layer to achieve electrical and thermal insulation, this is not thought to be the best approach. As to FIG. 11, isolation and/or insulation material are shown on the respective caps and substrates. (FIGS. 11a and 11b). As per the reasons described in connection with FIG. 10, it is better to have both thermally and electrically insulating characteristics for this isolation layer. However, this is a preferred feature related to the most preferred embodiment. The invention may be practiced without this preferred feature.

Figure 10A:
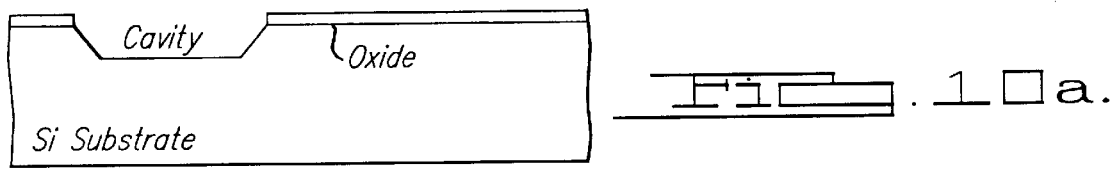
FIG. 10 is a schematic showing the process steps for forming a protective cap with cavity, the microheater circumscribing the cavity opening, and the bonding material for sealing the cap to a substrate.
Figure 10B:
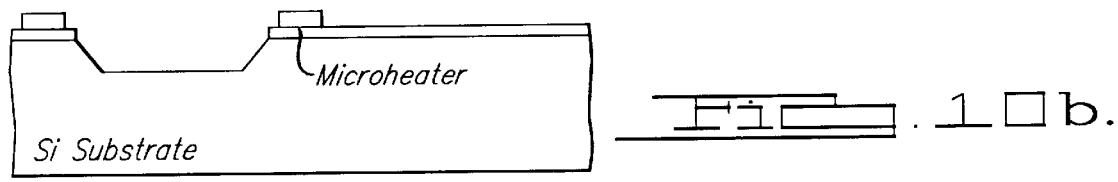
Figure 10C:
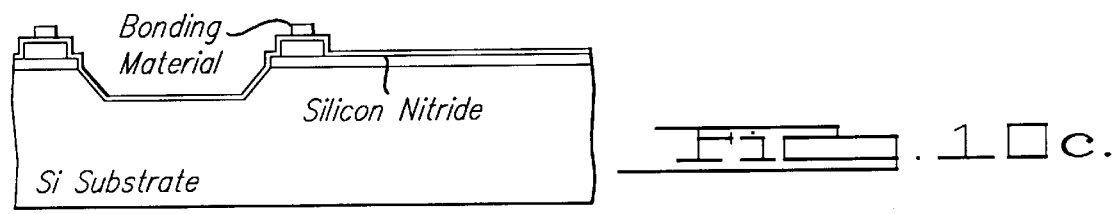

Proceeding from FIG. 10(a) to FIG. 10(b), the application of the microheater is shown. In this embodiment, the microheater is preferably polysilicon. This material is able to withstand and sustain a very high localized temperature and is therefore compatible with integrated circuit processes. For bonding processes that require a higher temperature, tungsten or other higher melting point materials can be used as the microheater. After polysilicon is deposited, it is doped with phosphorous and patterned as shown in FIG. 10(b). Next, a thin layer of silicon nitride is deposited over the surface of the structure to provide electrical insulation. This layer is also used as a masking material during the final etching step. After deposition of the silicon nitride, the bonding material is deposited and patterned as shown in FIG. 10(c). As required, an opening may be made to provide a wire bonding area for a MEMS device. Therefore, as per FIG. 10(d), the wire bonding area for MEMS chips is opened in the silicon nitride layer. Silicon is etched away to open up this area. In this example, the bonding material is selected to be resistant to the silicon etchant.

Figure 10D:
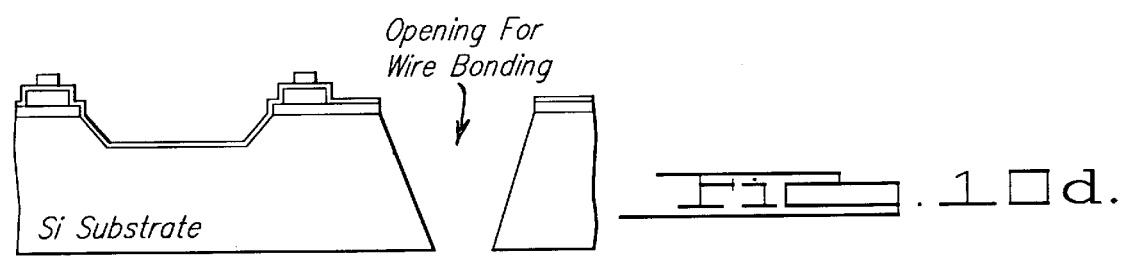
Figure 10E:
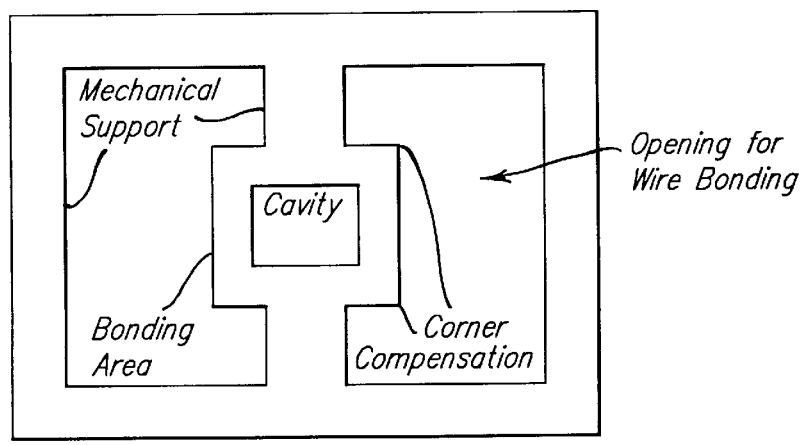
Figure 11A:
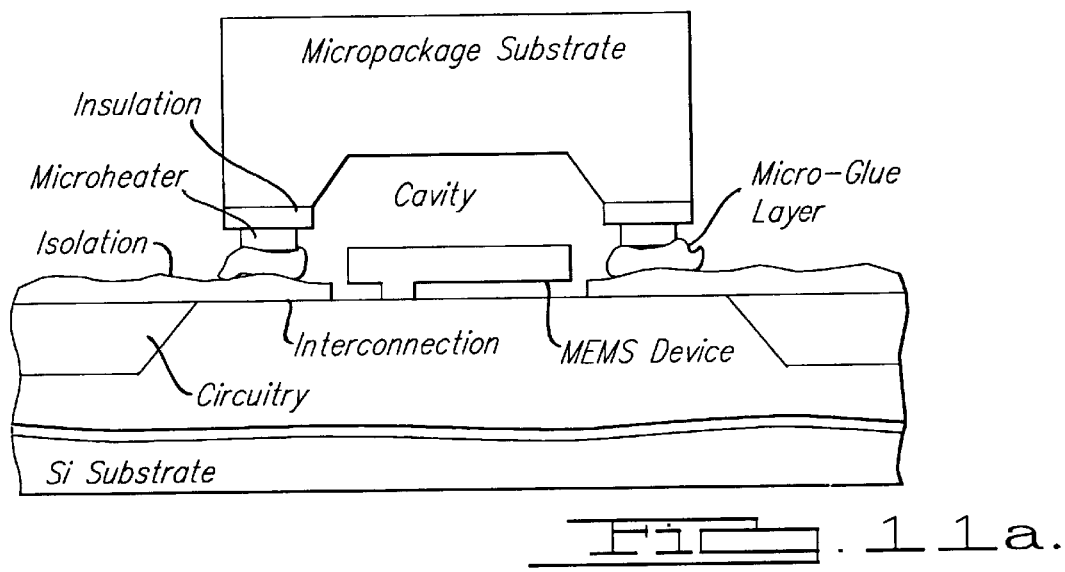
In FIG. 11a the bonding material is designated as micro-glue layer and is any type of material including chemical vapor deposited bonding material.
Figure 11B:
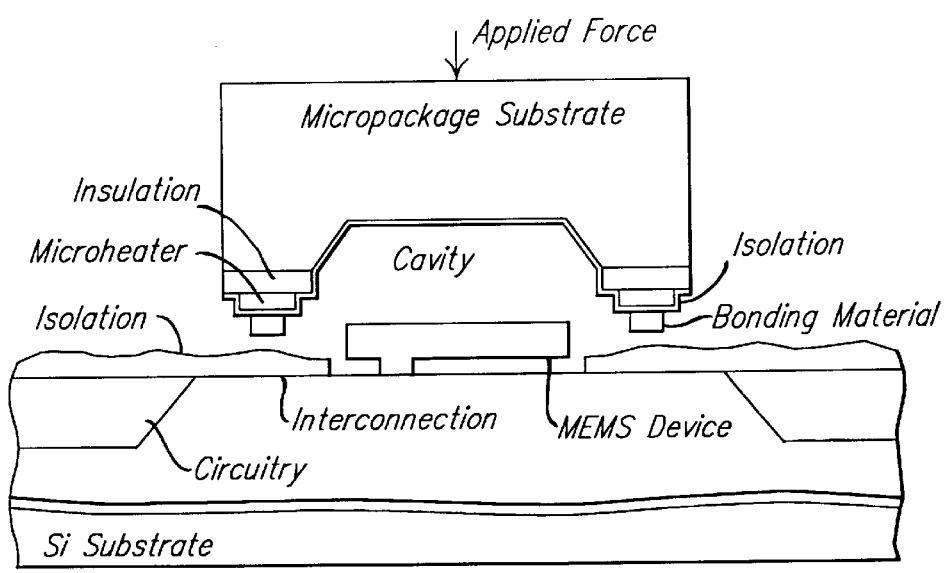
In FIG. 11b the cap is the same configuration as that prepared by the steps illustrated in FIG. 10.

The microstructure (microshell) prepared as per FIGS. 10(a) through 10(d) shows one example of a micropackage with a cavity, microheaters, and bonding material, specifically arranged for the post-packaging of a MEMS device by localized heating. For MEMS chips which have unprotected feed-through as interconnections, non-conducting materials should be used for bonding. For those where the electrical feed-through has been protected by insulation layers, electrically conductive material can be used as bonding material. FIG. 10(d) is generally viewed as the cross-sectional view of line A–A' in FIG. 10(e).

Figure 10F:
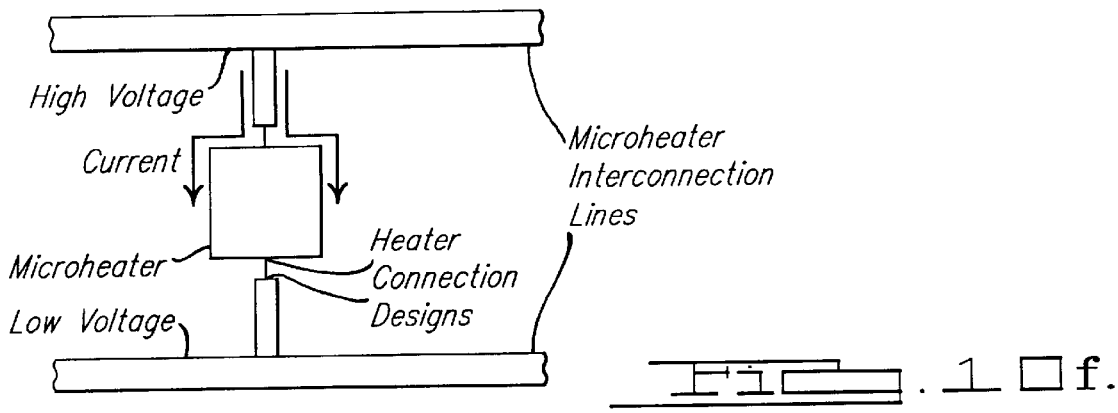
Figure 12:
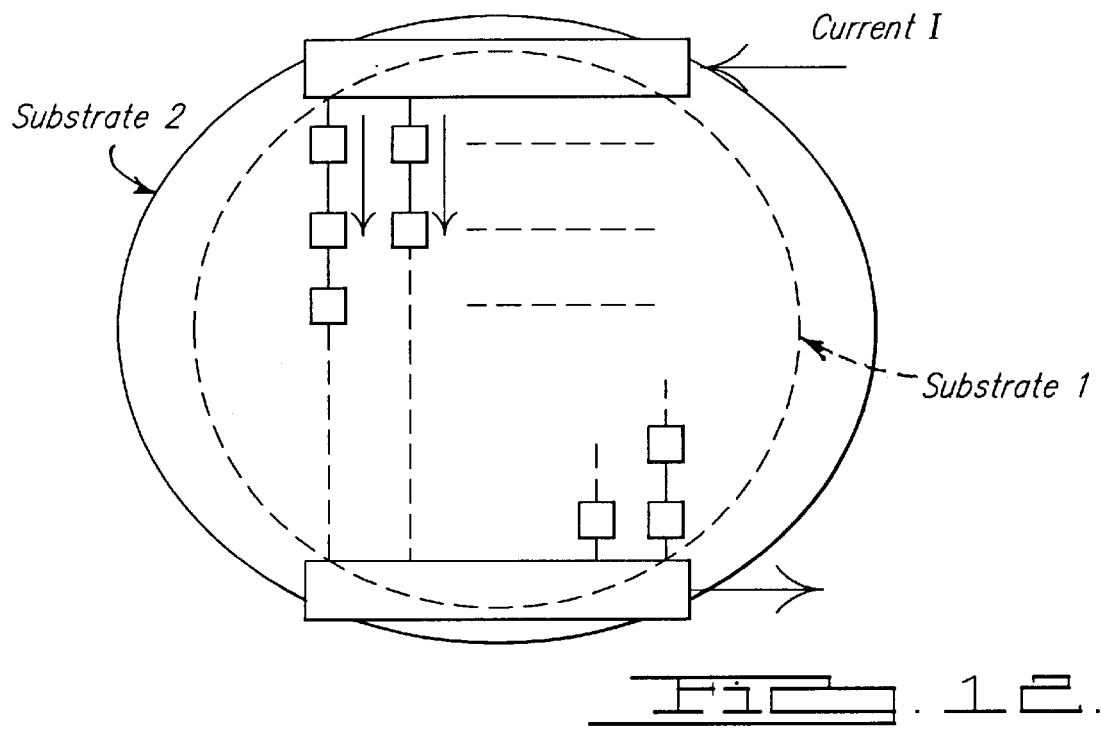
FIG. 12 is a schematic of an array of microheaters which are electrically connected together on a silicon substrate.

A prototype design for a composite microheater is shown in FIG. 10(f). More particularly, two microheaters which are electrically connected in parallel are utilized to form a combined composite closed-loop microheater. The composite closed-loop microheater design ensures that a micropackage (i.e., a microshell) bonded onto a MEMS wafer, for example, successfully encapsulates and hermetically seals the microdevice which is situated within the closed loop. As shown in FIG. 10(f), the two microheaters are connected in parallel between two main electrically conductive interconnection lines on the micropackage wafer substrate. The two interconnection lines have different voltage potentials to ensure that electrical current is conducted in parallel through the two microheaters. As would be recognized by one skilled in the electronic arts, numerous additional composite closed-loop microheaters can all be connected in parallel between the two interconnection lines. Alternatively, multiple composite closed-loop microheaters can also be connected in electrical series between the two interconnection lines provided space between the two lines permits such. Even further, as illustrated in FIG. 12, multiple composite closed-loop microheaters can be incorporated into an array of composite microheaters over the surface of the micropackage wafer, whereon the microheaters are connected in series and in parallel. As would be recognized by one skilled in the electronic arts, composite microheater array designs can also include more than two main interconnection lines such that a multiple array scheme or a super and sub-array scheme is developed. In this manner, such multiple composite microheater array schemes enable numerous microshells to be bonded simultaneously to the MEMS wafer when electrical current is passed through the microheater array(s). Thus, numerous MEMS (and/or microelectronic integrated circuits) can be encapsulated on the MEMS wafer and hermetically sealed at the same time instead of one at a time. As a result, MEMS devices can be easily and economically mass produced in a significantly shorter period of time. To ensure that the voltage-supplying interconnection lines on the micropackage substrate wafer can be accessed for activation when the micropackage substrate wafer is aligned and placed over the MEMS wafer, the diameter of the micropackage substrate wafer (substrate 2 in FIG. 12) should be larger than the diameter of the MEMS wafer (substrate 1 in FIG. 12) so that electrical contact pads along the outer periphery of the micropackage wafer can be accessed to pass current to the interconnection lines on the micropackage wafer for bonding.

Localized fusion and eutectic bonding processes have been successfully demonstrated. Phosphorous doped polysilicon and gold resistive heaters were used in silicon-to-glass fusion and silicon-to-gold eutectic bonding processes, respectively. It was found that both processes were accomplished in less than 5 minutes with excellent bonding strength and uniformity. In the silicon-to-glass fusion bonding process, an input current of about 31 mA was necessary to reach a bonding temperature of about 1300° C. In the silicon-to-gold eutectic bonding process, an input current of about 0.27 A is needed to reach a bonding temperature of about 800° C. These localized high-temperature bonding techniques greatly simplify MEMS fabrication and packaging at both the wafer and chip levels.

This new scheme has potential applications for MEMS fabrication and packaging that require low temperature processing at the wafer level, excellent bonding strength, and hermetic sealing characteristics. The methods and structures of the present invention are well suited to commercial production, are relatively economical, and meet the needs for packaging a variety of microdevices in a variety of circuit configurations, including composite devices which integrate both microelectronic integrated circuits with MEMS devices.

EXAMPLE 2—INDIRECT BONDING WITH AN INTERMEDIATE LAYER

In the direct bonding process method and associated structures described hereinabove, either phosphorus-doped polysilicon or gold was primarily utilized to serve the dual role of being both the heating material (i.e., a microheater) and the bonding material during the bonding process. As briefly alluded to hereinabove, one drawback of this direct bonding method is that the bonding materials may diffuse or melt during the bonding process and change the resistance of the microheater material. Such a change in resistance makes controlling the current which is applied to the microheater to control the temperature for facilitating the bonding process rather difficult. To remedy such, it is sometimes more desirable to introduce an added intermediate layer that functions only as the bonding material to thereby separate the roles of bonding and heating. As a result, better temperature control is achieved in order to soften the intermediate layers for successful bonding.

Figure 14A:
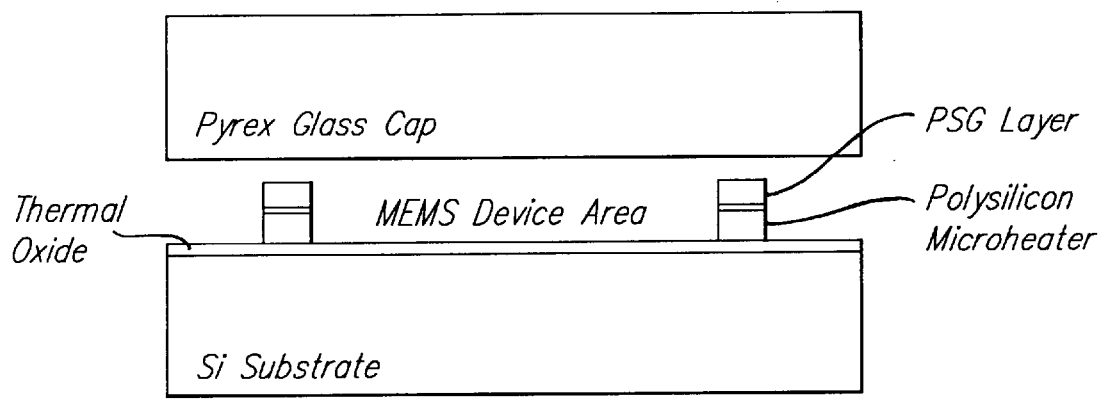
FIG. 14 is a schematic showing localized, indirect bonding methods and structures with intermediate layers, including (a) a cross-section view of PSG-to-glass bonding and (b) a cross-section view of Indium-to-glass bonding.
Figure 14B:
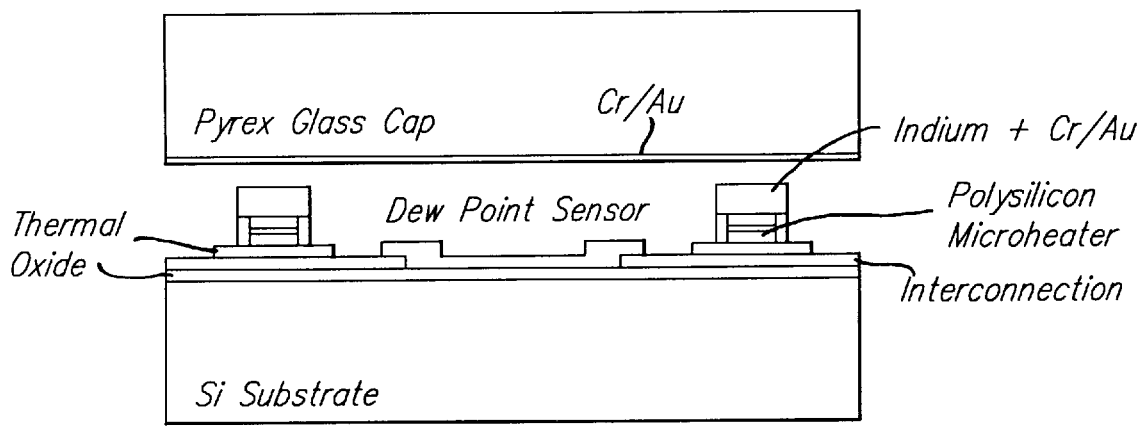

Two types of localized, indirect bonding processes which incorporate intermediate layers have been investigated, specifically PSG-to-glass fusion bonding (see FIG. 14(a)) and Indium-to-glass bonding (see FIG. 14(b)). In both of these bonding processes, polysilicon is used as the heating material (i.e., the microheater), and a thermal oxide layer is first grown on the silicon substrate to ensure electrical and thermal insulation. That is, the thermal oxide layer is grown on top of the silicon substrate layer for electrical insulation before the PSG or Indium solder layer depositions. A pressure of 1 MPa is applied on top of the two wafers, and a current of approximately 10 to 70 mA (the exact current selected depends on the design of the microheaters and the intermediate layer) is passed through the microheater. Ultimately, the intermediate PSG layer on top of the polysilicon microheater is stripped away and is instead attached to the glass wafer. As a result, an excellent PSG-to-glass bond is achieved, and the new bond is even stronger than the initial adhesion force between the deposited PSG and the polysilicon layer. Furthermore, the full depletion of the PSG intermediate layer onto the glass substrate (i.e., pyrex glass cap) ensures excellent bonding uniformity. The process of localized bonding via an intermediate layer serves to soften or reflow the bonding material itself, thereby avoiding the poor bonding results which typically occur when bonding surfaces are rough and not smooth.

In summary, while the present invention has been described in terms of certain embodiments and examples thereof, it is not intended that the invention be limited to the above description and embodiments, but rather only to the extent set forth in the following claims.

The embodiments of the present invention in which an exclusive property right or privilege is claimed are defined in the following claims.

What is claimed is:

1. A method for making a microstructure assembly, the method comprising the steps of:
   (i) providing a first substrate and a second substrate;
   (ii) depositing an electrically conductive material on the second substrate along a peripheral boundary line path of a predetermined area;
   (iii) contacting the second substrate carrying the electrically conductive material along the peripheral boundary line path with the first substrate to define a Predetermined volume therebetween; and then
   (iv) supplying current to the electrically conductive material to elevate the temperature of said electrically conductive material locally along the peripheral boundary line path and cause formation of a localized high-temperature bond between the first substrate and the second substrate to enclose the predetermined volume therebetween.

2. The method of claim 1 wherein the second substrate is one of a silicon wafer and glass wafer, the wafer having a layer of an oxide of silicon on the surface, which layer is thermally and electrically insulating.

3. The method of claim 1 further comprising the steps of:
   before the step of depositing the electrically conductive material, forming a cavity in the surface of the second substrate; and
   depositing said electrically conductive material along the peripheral boundary line path which circumscribes the opening of the cavity.

4. The method of claim 3 further comprising the step of:
   after the step of depositing the electrically conductive material, depositing a layer of electrically insulating material on the surface of the second substrate to cover at least the electrically conductive material and the interior surface of the cavity.

5. The method of claim 4 further comprising the step of:
   depositing a bonding material over the insulating layer in a pattern following along the peripheral boundary line path of the electrically conductive material.

6. The method of claim 4 wherein the layer of electrically insulating material of claim 4 is selected from the group consisting of silicon nitride, silicon dioxide, and mixtures thereof.

7. The method of claim 3 further comprising the step of:
   before step (iii) of claim 1, placing a microelectronic device on the surface of the first substrate, whereby step (iii) of contacting the first and second substrates provides sealing of the cavity with the microelectronic device disposed therein.

8. The method of claim 1 wherein the electrically conductive material is selected from the group consisting of gold, polysilicon, aluminum, platinum, tungsten, any other refractory metal, and mixtures thereof.

9. The method of claim 5 wherein the bonding material is selected from the group consisting of silicon dioxide, silicon, gold, copper, titanium, polysilicon, glass frit, PSG, BSG, soldering materials such as indium, silicon/gold alloy, and silicon/aluminum alloy, and mixtures thereof.

10. The method of claim 1 further comprising the step of:
    while current is being supplied in step (iv), applying a bonding material between said first and second substrates by decomposing a gas on contact with said electrically conductive material, thereby forming a decomposition product which bonds said substrates together.

11. The method of claim 3 wherein the cavity forming step includes one of the steps of etching the cavity and machining the cavity.

12. The method of claim 11 wherein the cavity etching step includes one of the steps of isotropic etching and anisotropic etching.

13. The method of claim 1 wherein the electrically conductive material depositing step includes one of the steps of chemical vapor deposition, sputtering and evaporation.

14. The method of claim 1 wherein the bond is one of a fusion bond, a eutectic bond and a soldering bond.

15. The method of claim 1 wherein the first substrate is silicon, the second substrate is silicon, the bonding material is gold and the bond is a eutectic bond formed by silicon and gold.

16. The method of claim 1 wherein the first substrate is silicon, the second substrate is silicon, the bonding material is polysilicon, and the bond is a fused silicon to silicon bond.

17. The method of claim 1 wherein the first substrate is glass, the second substrate is silicon, the bonding material is polysilicon, and the bond is a fusion bond formed between silicon and glass.

18. A method for simultaneously micropackaging a plurality of microdevices, the method comprising the steps of:
    fabricating a plurality of microdevices on a first substrate wafer such that the microdevices are arranged in a first array;
    fabricating a corresponding plurality of micropackages on a second substrate wafer such that the micropackages are arranged in a second array which is aligned to match the first array, the micropackages having a predetermined peripheral boundary line area defining an opening into an aperture of a predetermined volume;
    fabricating an array of microheaters on the micropackages of the second array along the predetermined peripheral boundary line area;
    fabricating electrically conductive interconnection lines between the microheaters;
    moving the first substrate and the second substrate toward each other until the array of micropackages comes into biased contact with the first substrate along an interface region, such that each microdevice in the first array is covered by one of the micropackages, and such that the array of microheaters is interposed at the interface region along the predetermined peripheral boundary line area between the first array of devices and the second array of micropackages; and
    applying electrical current through the interconnection lines to thermally activate the microheaters for localized high-temperature bonding and hermetically sealing the micropackages to the first substrate to thereby encapsulate and protect the devices on the first substrate.

19. The method according to claim 18, and further comprising the steps of:
    fabricating the first substrate wafer and the second substrate wafer such that the diameter of the second substrate wafer is larger than the diameter of the first substrate wafer; and
    fabricating electrically conductive contact pads on the second substrate wafer such that the contact pads are electrically connected to the interconnection lines, and such that the contact pads are proximate to the perimeter of the second substrate wafer whereby electrical current applied to the contact pads flows through the interconnection lines unobstructed when the first substrate wafer and the second substrate wafer are moved toward each other for bonding.

20. A method for making a microstructure assembly comprising the steps of:
    depositing an electrically conductive microheater material on one of a first substrate and a second substrate in a predetermined peripheral bonding area;
    contacting one of the substrates with the other substrate along the predetermined peripheral bonding area to define a predetermined volume therebetween; and resistive heat bonding the substrates to one another along the predetermined peripheral bonding area in response to applying current to the electrically conductive microheater material to form a localized high-temperature bond between the substrates and encapsulate the predetermined volume therebetween.

21. The method of claim 20 further comprising the steps of:

placing a microelectronic device on the surface of one of the first and second substrates; and hermetically sealing the microelectronic device within the predetermined volume defined between the first and second substrates.

22. The method of claim 21 further comprising the step of:

depositing a layer of insulating material on a surface of one of the first and second substrates to cover at least the electrically conductive material and an interior surface defining the predetermined volume.

23. The method of claim 22 further comprising the step of:

depositing a bonding material over the layer of insulating material in a pattern following along the predetermined peripheral bonding area of the electrically conductive material.

* * * * *